United States Patent [19]

Boshra-Riad et al.

[11] 4,443,867

[45] Apr. 17, 1984

[54] MAGNETIC BUBBLE STORE

[75] Inventors: Mokhtar Boshra-Riad, Giza, Egypt; Jean-Marc Fedeli, Saint Egreve, France; Hubert Jouve, Biviers, France; Daniel Mauduit, Rives sur Fure, France

[73] Assignee: Commissariat a l'Energie Atomique, Paris, France

[21] Appl. No.: 251,760

[22] Filed: Apr. 7, 1981

[30] Foreign Application Priority Data

Apr. 18, 1980 [FR] France ............................... 80 08765

[51] Int. Cl.³ ............................................ G11C 19/08
[52] U.S. Cl. ..................................... 365/19; 365/15; 365/36
[58] Field of Search ...................... 365/15, 16, 19, 20, 365/21, 36

[56] References Cited

U.S. PATENT DOCUMENTS

| | | | |
|---|---|---|---|
| 3,916,396 | 10/1975 | Kohara | 365/15 |
| 4,142,250 | 2/1979 | Keefe et al. | 365/36 |
| 4,143,419 | 3/1979 | Bobeck | 365/19 |
| 4,157,591 | 6/1979 | Dekker et al. | 365/19 |
| 4,187,555 | 2/1980 | Bobeck | 365/19 |

FOREIGN PATENT DOCUMENTS

WO79/00360 6/1979 PCT Int'l. Appl. ................. 365/19

*Primary Examiner*—James W. Moffitt
*Attorney, Agent, or Firm*—Oblon, Fisher, Spivak, McClelland & Maier

[57] ABSTRACT

A magnetic bubble store formed of a series of longitudinally oriented shift registers and at least one transversely oriented access contour register having a single access point corresponding to each access end of each longitudinally oriented shift register, wherein magnetic bubbles are displaced in the longitudinally oriented shift registers by applying a rotary magnetic field thereto, and wherein magnetic bubbles are displaced in the transversely oriented access contour register by applying an electric current thereto. The longitudinally oriented registers are formed of motifs defined by ion implantation in a magnetic garnet layer. Structure for applying the electrical current to the access contour register includes two conductive sheets superimposed on the magnetic garnet layer in the vicinity of the access ends of the longitudinally oriented registers, wherein the sheets are insulated from one another and from the magetic garnet and include openings arranged in the vicinity of respective access ends of the longitudinally oriented shift registers. Other openings are positioned so as to forward the bubbles which have obtained access to the longitudinally oriented shift registers to an access station or to other longitudinally oriented shift registers.

6 Claims, 2 Drawing Figures

MAGNETIC BUBBLE STORE

BACKGROUND OF THE INVENTION

1. Field of the Invention

The present invention relates to a magnetic bubble store. It is applicable to the storage of binary information or bits, materialized in the form of isolated magnetic domains, called bubbles. These domains have the opposite magnetization to that of the remainder of the magnetic material constituting the layer in which they are formed.

Each bubble can be displaced by a force and movement can take place freely in any direction in the plane of the magnetic layer. The magnetic layer is a magnetic garnet and the bubbles are formed in said layer by applying a d.c. magnetic field thereto perpendicular to the plane of the layer. This field is in practice produced by a permanent magnet and ensures the non-volatility of the data contained in the store.

The magnetic garnet layer in which the bubbles are formed is generally supported by a non-magnetic, monocrystalline garnet.

2. Description of the Prior Art

It is known to displace the bubbles by applying a rotary magnetic field, whose function is to create poles on e.g. permalloy motifs or patterns, having the shape of T-bars, chevrons or half-disks. As result shift registers are obtained in which the binary information is represented by the presence "1" or the absence "0" of a bubble. In addition to these permalloy motifs it is known that it is necessary to use electrical conductors for producing on the bubble store chip writing, data recording, non-destructive reading, transfers between registers and erasure functions. Erasure is performed in bitwise manner by the selective or overall destruction of the bubbles. This erasure is obtained very simply by increasing the value of the d.c. magnetic field beyond the maximum value permitted for the recording.

In order to displace the bubbles in the magnetic garnet layer two methods are at present used, whereby the bubbles can be displaced either by an electrical current or by a magnetic field.

The best known magnetic bubble store types are described below.

Stores constituted by a single looped register, which can be called series organization stores in which there is a single, very long, looped shift register are known. This register is provided with a single access station able to give access to only one bit at once. Although very simple, this type of store requires a very long access time and does not permit any random access. The absolutely perfect manufacture thereof is required. Thus, any defect can lead to an interruption in the chain or string of bubbles representing the data contained in the store.

Stores having an organization into "minor-major registers" are also known. These stores comprise a system of recording loops called "minor registers," making it possible to record data. Another loop called the "major register" comprises the access station. The minor registers are longitudinally juxtaposed and the major register is oriented transversely. The magnetic bubbles contained in the minor registers can be transferred into the major register via transfer gates. These gates make the structure and manufacture of the store more complicated. In addition, the access time is high, because the magnetic bubbles can pass through the entire length of the major register before reaching the access station, then follow an equivalent path for their return into the minor registers. Finally the displacement in the minor register is unidirectional as a result of the synchronization contraints in the propagation of the bubbles between the minor registers and the major register.

Bubble stores comprising a series of shift registers or minor registers arranged in longitudinal manner and a transversely positioned major register are known. In this type of store the major register is called an access contour or outline and is incorporated into the minor registers which thus participate by at least two bits in the access outline. In this case the influence of the access outline can be prejudicial on the adjacent bubbles. Thus, by creating the magnetic field gradients necessary for the displacement of the bubbles on this access outline there can be a weakening of the adjacent bubbles in the store area in question.

In the case of the two latter store types, which generally use minor registers constituted by permalloy motifs shaped like a T, chevrons or half-disks, it is impossible to ensure a transfer of the bubbles from one minor register to another. In the case of half-disks motifs the distribution of the magnetic potentials along the major register is not homogeneous and during the transfer of the bubbles along the major register there are discontinuities in the field which can lead to a weakening of the bubbles.

Finally the Expert has often considered it to be important to only have a single access point between a minor register and a major register, without it hitherto being possible to produce a store fulfilling this condition.

SUMMARY OF THE INVENTION

The invention makes it possible to realize this condition by using different means for the circulation of the bubbles in the minor registers and in the major registers.

The invention aims at obviating the aforementioned disadvantages and more particularly at providing a bubble store in which the data contained in the longitudinally oriented, minor shift registers can be transmitted bitwise to a transversely oriented access contour or outline as a result of the presence of a single tangency point between the end of each shift register and the access outline. This store also makes it possible to prevent any length constraints with respect to the shift registers and the access outlines. It also makes it possible to rapidly ensure access to two consecutive addresses of the same shift register by a single shift in the register. Finally it obviates the necessity of using access gates, whose high resistance produces a significant dissipation in known stores. The invention also makes it possible to produce stores by means of a planar technology without using half-disks, T or chevron motifs and without using protuberant motifs, because it is no longer necessary to provide gates between the shift registers and the access outline. There is also no longer any need to take account of phase displacements between the pulses permitting the transfer of the bubbles into the access outline and the rotary field permitting the displacements of the bubbles into the shift registers.

The present invention relates to a magnetic bubble store comprising a series of longitudinally oriented shift registers and at least one transversely oriented register, constituted by storage points of the shift registers and called an access contour or outline, as well as means for producing a displacement of the bubbles in the registers by applying a rotary magnetic field, wherein the longitudinal registers are constituted by motifs defined by ion implantation in a magnetic garnet layer, the transverse access outline having a single access point at each access end of the registers.

According to another feature of the invention the access outline comprises access means by electrical current.

According to another feature of the invention the access means by electrical current comprise two conductive sheets superimposed on the magnetic garnet layer in the vicinity of the access ends of the registers, the sheets being insulated from one another and from the magnetic garnet and having openings arranged in such a way that at least one of the sheets has openings in the vicinity of the access ends of the registers, the other openings of the sheets being positioned so as to forward the bubbles which have in this way obtained access to the registers to an access station or to other registers in the series.

According to another feature of the invention the access outline comprises access motifs defined by ion implantation, the access means by electrical current being constituted by a conductive sheet superimposed on the magnetic garnet layer in the vicinity of the access ends of the registers, the sheet being insulated from the layer and provided with openings arranged in such a way that certain of the said openings are respectively tangential with the access ends of the registers, the other openings cooperating with the access motifs so as to forward the bubbles to an access station or to other registers in the series.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

Figure 1:
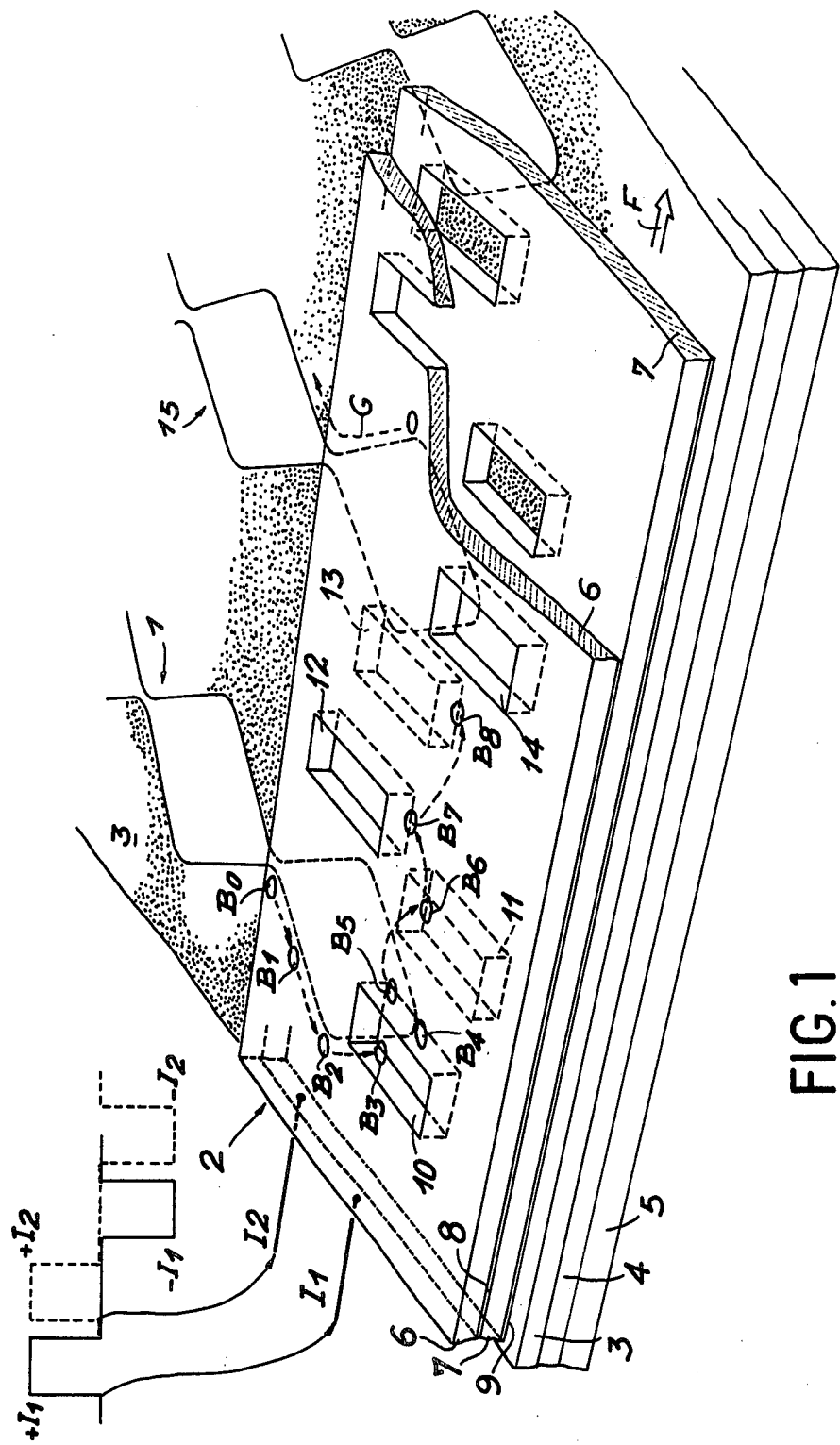
FIG. 1 is a schematic perspective view partly cut away of a first embodiment of a magnetic bubble store according to the invention.

FIG. 1 diagrammatically shows a first embodiment of a magnetic bubble store according to the invention. This store comprises a series of longitudinally oriented shift registers 1 and at least one access outline or contour 2 for the registers. It also comprises a known device (not shown) for producing a displacement of the bubbles in registers 1 by applying a rotary magnetic field. These known means can be constituted by coils arranged in quadrature and rotating at a constant frequency. This rotary field can be eliminated and reestablished without disturbing the data in such a way that there is no need to energize the store when it is not functioning. Obviously this store also comprises a known device (not shown) making it possible to produce bubbles in the shift registers. These bubbles are created, as required, for example by means of a conductor producing a field opposite to the polarization field. The longitudinal registers 1 are constituted by motifs having the approximate configuration of lozenges. However, although this is the configuration shown in the drawing, other shapes are possible and they are defined by ion implantation in a magnetic garnet layer 3 of formula e.g. Gd YTmGalG. This ion implantation is obtained by masking and by e.g. $He^+$ ion bombardment. This ion implantation is performed externally of the lozenges shown in the drawing and the bubbles are formed and circulate by following the outer contour of the lozenges in a magnetic garnet layer 4 which can be called a recording layer and which can be formed, e.g. from a material of formula EuYTmGalG. For example the layer 3 containing the implanted motifs has a thickness of $4\mu$, whilst the layer 4 in which the bubbles are formed has a thickness of $1\mu$. Finally and in known manner the two preceding layers are supported by a non-magnetic substrate e.g. of formula $Gd_3Ga_5O_{12}$. According to the invention the motifs defined by ion implantation and which are longitudinally positioned have at each of their access ends a single access point to the transverse access outline 2, in such a way that the access to each shift register takes place bubble by bubble. In the represented embodiment the bubbles circulate externally of the motifs and, for a complete rotation of the rotary magnetic field, a bubble located e.g. in position $B_0$ will successively occupy positions $B_1$, $B_2$, $B_3$, $B_4$ for each quarter rotation of the rotary field applied. In the described embodiment the bubble occupying position $B_4$ can be taken into account by access outline 2. It is apparent in the drawing that access to each of the registers takes place bubble by bubble. According to the invention this access outline is accessed by means of an electrical current source (not shown) which will be described in greater detail hereinafter, and which makes it possible to stop the device for applying the rotary magnetic field to the shift register during the operation of the access means. In this first embodiment of the store according to the invention the access electrical current source includes two magnetic sheets 6, 7 superimposed on the magnetic garnet layer 3 located in the vicinity of the access to the shift registers 1. These sheets are insulated from one another and from the magnetic garnet 3 by layers 8, 9, e.g. of silicon dioxide. They have openings 10, 11, 12, 13, 14 etc. located in such a way that at least one of the sheets such as e.g. sheet 6 has openings 10 respectively facing the access ends of registers 1. The other openings such as 11, 12, 13 are arranged so as to forward the bubbles which have obtained access in this way to each of the registers towards an access station (not shown) or towards another register such as e.g. register 15 in the series of longitudinal registers. The displacement of the bubbles as a result of the two conductive sheets provided with openings is brought about by connecting these sheets to power supplies (not shown), which supply double polarity current pulses. These pulses are represented at $I_1$ and $I_2$ in the drawing and successively and respectively have amplitudes $+I_1$, $+I_2$, $-I_1$, $-I_2$. When a bubble has entered one of the registers, e.g. 1 at position $B_4$ the rotary field is stopped and pulse $+I_1$ is applied to the conductive sheet 6. In a per se known manner this pulse leads to the appearance on either side of opening 10 of positive and negative poles in such a way that the bubble is attracted towards the positive pole in position $B_5$. A pulse $+I_2$ is then applied to the conductive sheet 7 in such a way that positive and negative poles appear on either side of the opening 11 produced in the conductive sheet. The bubble is then attracted into position $B_6$. A negative pulse $-I_1$ is then applied to the conductive sheet 6 and this leads to the appearance of positive and negative poles on either side of the opening 12, as shown in the drawing. The bubble is then attracted into position $B_7$. A pulse $-I_2$ is then applied to conductive sheet 7 in such a way that positive and negative poles appear, as shown in the drawing, on either side of opening 13 in said sheet. The bubble is then attracted into position $B_8$. The bubble to which access was obtained in position $B_4$ can then be forwarded in the direction of arrow F towards an access station (not shown) by successive applications of the aforementioned pulses $I_1$ and $I_2$. At the time when the bubble faces opening 14 it is also possible to stop the application of pulses to conductive sheets 6, 7 and again apply the rotary field in such a way as to circulate the bubble by successive displacements in register 15 up to a predetermined position in accordance with the route shown by arrow G.

The travels of the bubbles in the longitudinal registers and in the access outline have a single common point corresponding to the stable position of a bubble at the end of each register.

Figure 2:
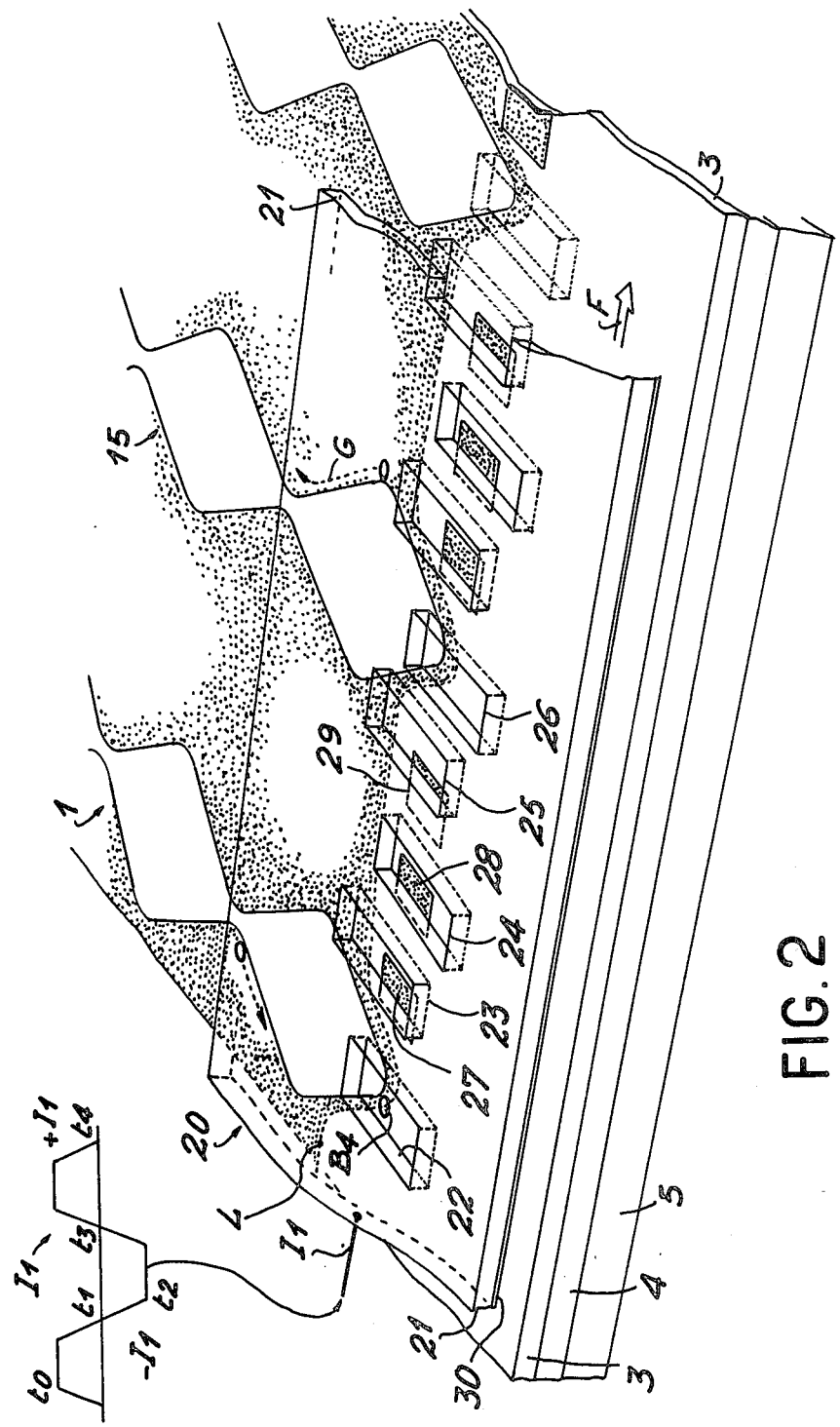
FIG. 2 is a schematic perspective view partly cut away of another embodiment of the bubble store according to the invention.

FIG. 2 diagrammatically shows another embodiment of a bubble memory according to the invention. The same elements carry the same references as in FIG. 1. As in the first embodiment there are longitudinally oriented shift registers 1, 15 etc. and which are formed by motifs defined by ion implantation in a magnetic garnet layer 3 superimposed on a magnetic garnet layer 4 in which are formed the bubbles. This drawing also shows supporting layer 5 for the two aforementioned layers. According to this other embodiment the access outline designated here by reference numeral 20 comprises an access electrical current source constituted by the conductive sheet 21 having openings 22, 23, 24, 25, 26, etc. This conductive sheet is superimposed on magnetic garnet layer 3 containing the motifs defined by ion implantation. The conductive sheet is separated from layer 4 by insulating layer 30. In this embodiment of the memory according to the invention the conductive sheet is associated with motifs 27, 28, 29 etc. defined by ion implantation in magnetic garnet layer 3. Certain of the openings such as 22 and 26 made in conductive sheet 21 are located in the vicinity of the access ends of registers 1, 15, whilst the other openings such as 23, 24, 25 cooperate with motifs 27, 28, 29 defined by ion implantation in such a way as to forward each bubble collected at the end of a register either towards an access station (not shown) in the direction of arrow F or towards another register such as register 15 in the direction of arrow G. In the described embodiment the bubble in question is that collected in position $B_4$ at the end of register 1. The travel of the bubbles in the access outline 20 takes place in the following way. The conductive sheet 21 is connected to a power supply (not shown), which applies to the sheet double polarity current pulses $I_1$. When the bubble is located in position $B_4$ at the end of register 1 the rotary field is stopped. The bubble is then attracted into opening 22 as a result of the appearance of positive and negative poles produced on either side of opening 22, as a result of current pulse $+I_1$, in conductive sheet 21. At time $t_1$ the current in the conductive sheet is zero and the bubble faces motif 27. At time $t_2$ a negative pulse $-I_1$ is applied to conductive sheet 21, positive and negative poles appearing on either side of opening 23, which then attracts the bubble. At time $t_3$ the bubble faces motif 28, whilst at time $t_4$ the application of a positive pulse $+I_1$ to the conductive sheet 21 brings about the appearance of positive and negative poles on either side of opening 24 and the bubble is attracted into opening 24. The process is identically repeated in such a way that the bubble is directed towards an access station (not shown) in the direction of arrow F or towards another shift register of the series of registers, such as e.g. register 15 in the direction of arrow G. Thus, when the bubble reaches opening 26 it is again possible to apply the rotary magnetic field to the shift registers in such a way that the bubble circulates in the opposite direction e.g. in register 15. In this drawing L is the limit of the implanted area forming the registers.

The store described hereinbefore has a low resistance access outline (below 50 ohms), whereas in the known bubble stores this resistance is approximately 1500 ohms, leading to a significant dissipation of heat. The control voltages of the store according to the invention are twenty times lower than in the known stores. The size of the store can be reduced 10 to 100 times for the same recording capacity. Moreover the throughput is greatly improved compared with known stores because data can be transferred at a frequency of 2 MHz, whereas in known stores this frequency is approximately 200 kHz. Finally, as a result of the elimination of the transfer gates planar technology can be used for the store according to the invention.

The invention can also be realized if layers 3 (layer containing the implanted motifs) and 4 (layer in which the bubbles are formed) coincide.

What is claimed as new and desired to be secured by Letters Patent of the United States is:

1. A magnetic bubble store comprising:
    a series of longitudinally oriented shift registers each having an access end,
    at least one transversely oriented access contour register having a single access point corresponding to each access end of each longitudinally oriented shift register,
    access means for applying electrical current to said access contour register to control the access to said longitudinally oriented shift registers,
    means for producing displacement of the bubbles in the longitudinally oriented shift registers by applying a rotary magnetic field,
    said longitudinally oriented shift registers comprising motifs defined by ion implantation in a magnetic garnet layer,
    said access means comprising two conductive sheets superimposed on the magnetic garnet layer in the vicinity of the access ends of the longitudinally oriented shift registers, said sheets being insulated from one another and from the magnetic garnet and provided with openings arranged such that at least one of the sheets has openings in the vicinity of the access ends of the longitudinally oriented shift registers, the other openings of said sheets being positioned so as to forward the bubbles which have in this way obtained access to the longitudinally oriented shift registers to an access station or to other longitudinally oriented shift registers in the series.

2. A bubble store according to claim 1, wherein said access means comprises:
    power supplies supplying double polarity current pulses to respective of said conductive sheets.

3. A bubble store according to claim 1, further comprising:

means for stopping the means for applying the rotary magnetic field during operation of the access means.

4. A magnetic bubble store comprising:
a series of longitudinally oriented shift registers each having an access end;
at least one transversely oriented access contour register having a single access point corresponding to each access end of each longitudinally oriented shift register;
access means for applying electrical current to said access contour register to control the access to said longitudinally oriented shift register;
means for producing displacement of the bubbles in the longitudinally oriented shift registers by applying a rotary magnetic field;
said longitudinally oriented shift registers comprising motifs defined by ion implantation in a magnetic garnet layer;
said access contour register comprising access motifs defined by ion implantation;
said access means comprising at least one conductive sheet superimposed on the magnetic garnet layer in the vicinity of the access ends of the longitudinally oriented shift registers, said sheet being insulated from said layer and including openings arranged such that certain of the said openings are respectively tangential with the access ends of the longitudinal oriented shift registers, the other openings cooperating with the access motifs so as to forward the bubbles to an access station or to other longitudinally oriented shift registers in the series.

5. A bubble store according to claim 4, wherein said access means comprises:
a power supply supplying double polarity current pulses to said conductive sheet.

6. A bubble store according to claim 4, comprising:
means for stopping the means for applying the rotary magnetic field during operation of the access means.

* * * * *